US012724953B2

(12) United States Patent
Muller et al.

(10) Patent No.: US 12,724,953 B2
(45) Date of Patent: Sep. 1, 2026

(54) BIT LINE ALIGNMENT FOR THE REDUCTION OF SOFT ERRORS

(71) Applicant: International Business Machines Corporation, Armonk, NY (US)

(72) Inventors: K. Paul Muller, Wappingers Falls, NY (US); Luiz C. Alves, Hopewell Junction, NY (US); William J. Clarke, Poughkeepsie, NY (US); Steven R. Carlough, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 939 days.

(21) Appl. No.: 18/062,098

(22) Filed: Dec. 6, 2022

(65) Prior Publication Data

US 2024/0184971 A1 Jun. 6, 2024

(51) Int. Cl.
*G06F 30/392* (2020.01)

(52) U.S. Cl.
CPC .................................. *G06F 30/392* (2020.01)

(58) Field of Classification Search
CPC ..................................................... G06F 30/392
USPC .......................................................... 716/119
See application file for complete search history.

(56) References Cited

U.S. PATENT DOCUMENTS 6,204,516 B1 3/2001 Shabde et al.
6,876,572 B2 4/2005 Turner
7,166,847 B2 1/2007 Hannah
7,309,866 B2 12/2007 Hannah
8,032,817 B2 10/2011 Ngo
8,797,790 B1 8/2014 Rahim et al.
9,195,282 B2 11/2015 Shelnutt et al.
10,990,471 B2 4/2021 Ross
2012/0106225 A1* 5/2012 Deng ..................... G06F 30/39 716/55
2017/0091021 A1* 3/2017 Abedifard ........... G11C 11/1693

FOREIGN PATENT DOCUMENTS

WO 2006012166 A2 2/2006

OTHER PUBLICATIONS

A. Elabd Research Gate Net Posts, URL: https://www.researchgate.net/post/Are_scattered_neutrons_in_the_forward_and_backward_directions_having_the_the_same_probability, Retrieved: Apr. 21, 2021, 10 pages.

(Continued)

*Primary Examiner* — Eric D Lee
(74) *Attorney, Agent, or Firm* — CANTOR COLBURN LLP; Edward Wixted

(57) ABSTRACT

A method for bit line alignment during the design of an integrated circuit is provided. Aspects include receiving a chip design for the integrated circuit and receiving an intended orientation of the integrated circuit. Aspects also include identifying one or more elements of the chip design that include word lines that are oriented in a substantially gravitational direction and modifying the chip design to perform one or more of rotating the one or more elements such that the word lines are no longer oriented in a substantially gravitational direction and rotating the one or more elements such that the word lines are oriented in a direction substantially perpendicular to the gravitational direction. Aspects further include causing the fabrication of the integrated circuit based on the modified chip design.

20 Claims, 7 Drawing Sheets

(56) References Cited

OTHER PUBLICATIONS

ITU-T Telecommunication Standardization Sector of ITU-T, K.124, International Telecommunication Union, 2016, 26 pages.
Karnik, et al, "Characterization of Soft Errors Caused by Single Event Upsets in CMOS Processes", IEEE Transactions on Dependable and Secure Computing, vol. 1, No. 2, Apr.-Jun. 2004, pp. 128-143.
Kuo, "Determination of the Angular Distribution of Cosmic Rays at Sea Level", Massachusetts Institute of Technology, 2010, pp. 1-59.

* cited by examiner

Figure 1:
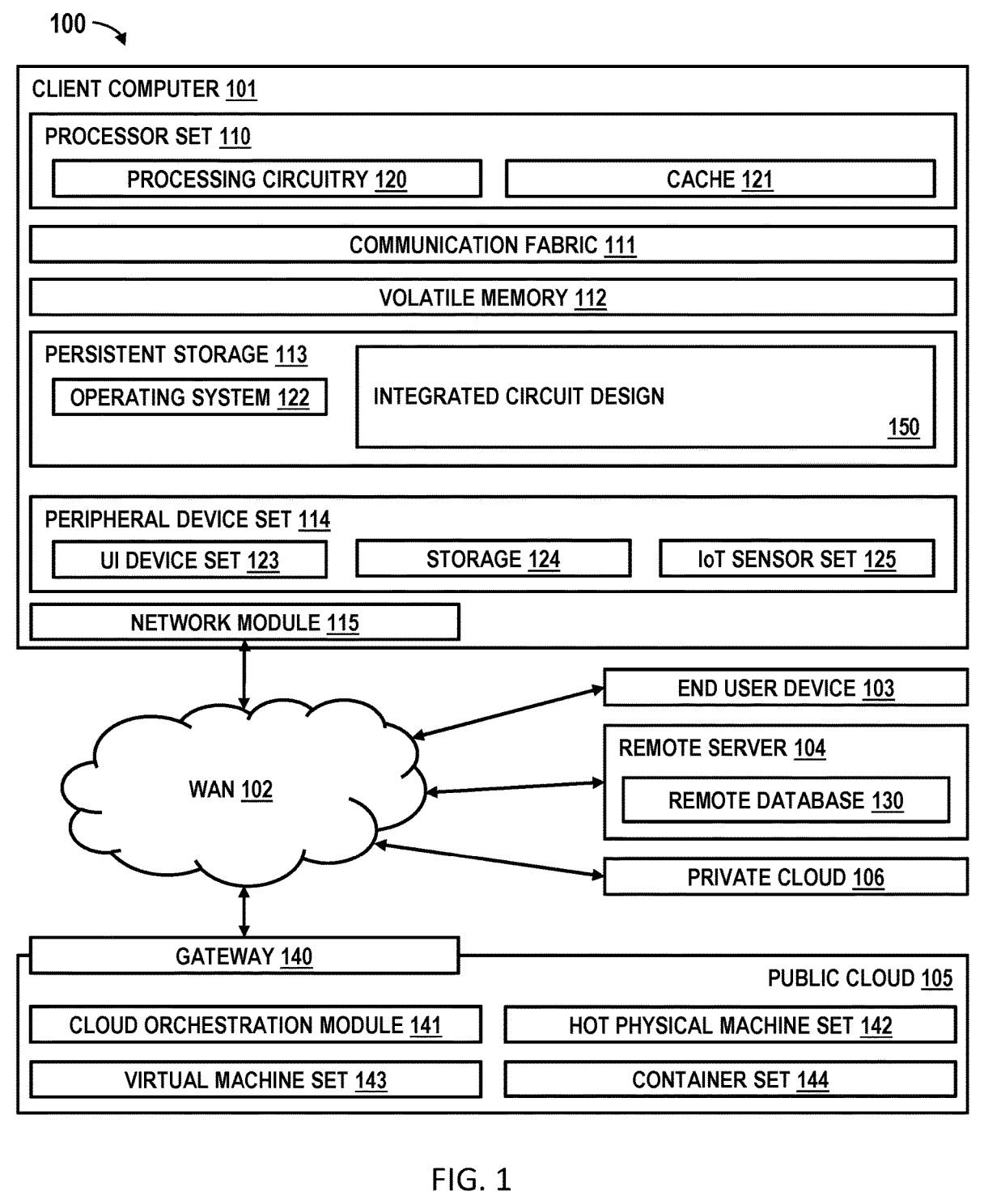

100

CLIENT COMPUTER 101
PROCESSOR SET 110
PROCESSING CIRCUITRY 120
CACHE 121
COMMUNICATION FABRIC 111
VOLATILE MEMORY 112
PERSISTENT STORAGE 113
OPERATING SYSTEM 122
INTEGRATED CIRCUIT DESIGN 150
PERIPHERAL DEVICE SET 114
UI DEVICE SET 123
STORAGE 124
IoT SENSOR SET 125
NETWORK MODULE 115
END USER DEVICE 103
REMOTE SERVER 104
REMOTE DATABASE 130
WAN 102
PRIVATE CLOUD 106
GATEWAY 140
PUBLIC CLOUD 105
CLOUD ORCHESTRATION MODULE 141
HOT PHYSICAL MACHINE SET 142
VIRTUAL MACHINE SET 143
CONTAINER SET 144

BIT LINE ALIGNMENT FOR THE REDUCTION OF SOFT ERRORS

BACKGROUND

The present invention relates to integrated circuits, and more specifically, to bit line alignment for the reduction of soft errors.

As integrated circuits continue to be made smaller, dependability is becoming increasingly important. For example, it has long been known that bit-flip errors in integrated circuits can be caused by radiation particles. However, as the size of integrated circuits becomes smaller, radiation-induced faults, such as single-event upsets (SEUs) and multi-bit upsets (MBUs), are becoming more common. An SEU or MBU can occur when a radiation particle passes through an integrated circuit. Upon impacting an integrated circuit, the particle may convert its kinetic energy to electrical energy which can be deposited in the circuitry. This energy can affect the state of the circuitry, for example flipping a bit, if the deposited energy exceeds the energy level which is required to hold the correct state. An SEU occurs when a particle changes the state of a single circuit element and an MBU occurs when a particle changes the state of two or more circuit elements. It is well known that cosmic rays and other common radiation types can result in SEUs and MBUs in integrated circuits. Indeed, as integrated circuits continue to decrease in size, lower energies are needed to change the internal state of the circuitry. Therefore, radiation-induced faults are becoming a reliability concern for modern integrated circuits.

Currently, faults in integrated circuits, such as MBUs, can be detected and/or corrected through the use of advanced error control techniques. However, such advanced error correction techniques require substantial overhead and are accordingly undesirable.

SUMMARY

According to an exemplary embodiment, a method for bit line alignment for the reduction of soft errors during the design of an integrated circuit. The method includes receiving a chip design for the integrated circuit and receiving an intended orientation of the integrated circuit. The method also includes identifying one or more elements of the chip design that include word lines that are oriented in a substantially gravitational direction and modifying the chip design to perform one or more of rotating the one or more elements such that the word lines are no longer oriented in a substantially gravitational direction and rotating the one or more elements such that the word lines are oriented in a direction substantially perpendicular to the gravitational direction. The method further includes causing the fabrication of the integrated circuit based on the modified chip design.

According to another exemplary embodiment, a computer system for bit line alignment for the reduction of soft errors during the design of an integrated circuit. The computer system includes a processor, the computer system configured to perform a method. The method includes receiving a chip design for the integrated circuit and receiving an intended orientation of the integrated circuit. The method also includes identifying one or more elements of the chip design that include word lines that are oriented in a substantially gravitational direction and modifying the chip design to perform one or more of rotating the one or more elements such that the word lines are no longer oriented in a substantially gravitational direction and rotating the one or more elements such that the word lines are oriented in a direction substantially perpendicular to the gravitational direction. The method further includes causing the fabrication of the integrated circuit based on the modified chip design.

According to another exemplary embodiment, a computer program product having a computer readable storage medium having program instructions embodied therewith is provided. The program instructions executable by one or more processors to cause the one or more processors to perform operations that include receiving a chip design for the integrated circuit and receiving an intended orientation of the integrated circuit. The operations also include identifying one or more elements of the chip design that include word lines that are oriented in a substantially gravitational direction and modifying the chip design to perform one or more of rotating the one or more elements such that the word lines are no longer oriented in a substantially gravitational direction and rotating the one or more elements such that the word lines are oriented in a direction substantially perpendicular to the gravitational direction. The operations further include causing the fabrication of the integrated circuit based on the modified chip design.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 1 is a block diagram illustrating one example of a processing system for the practice of the teachings herein;

DETAILED DESCRIPTION

Figure 2:
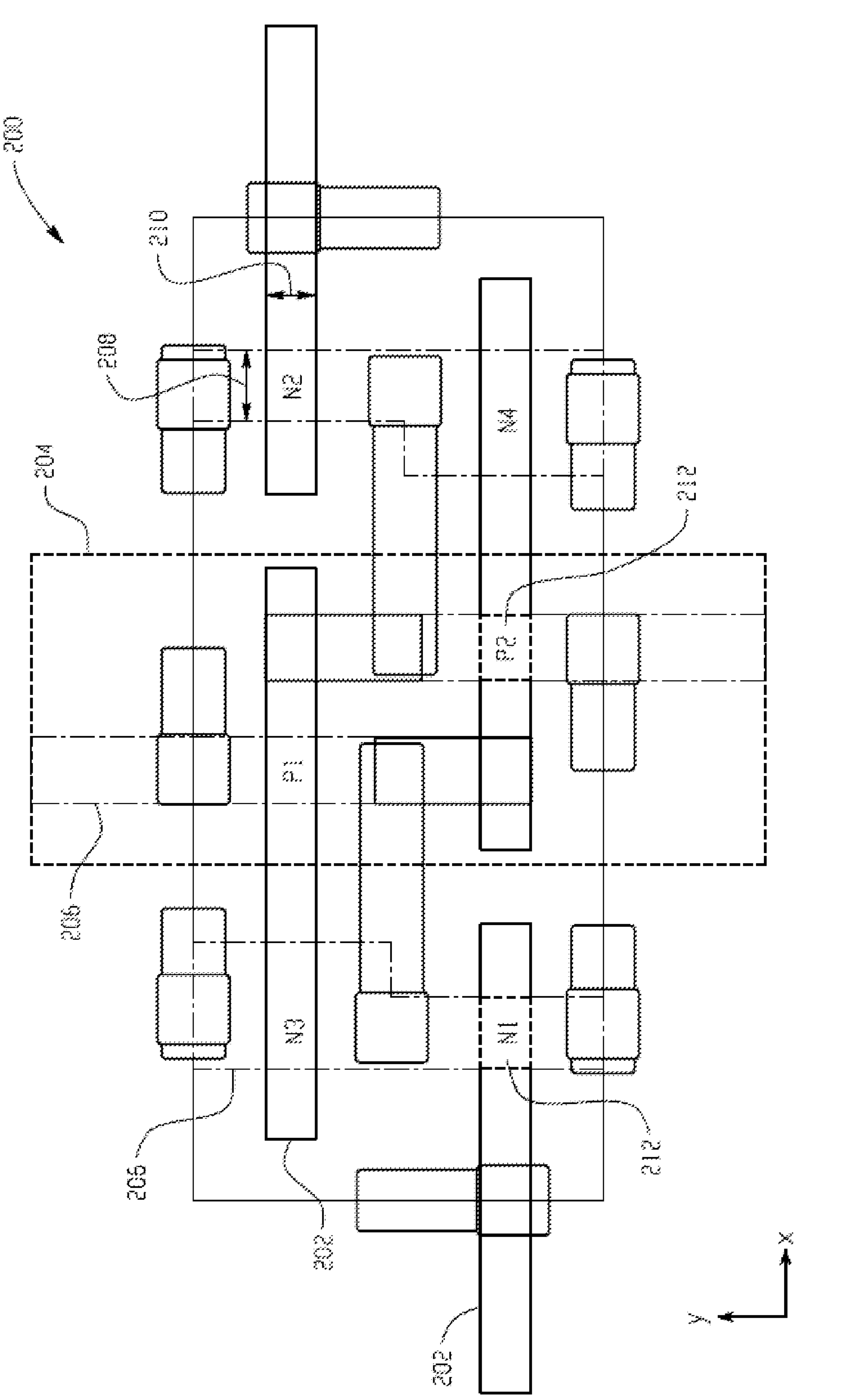
FIG. 2 is a block diagram illustrating an exemplary six-transistor SRAM cell in accordance with the disclosure.

Various aspects of the present disclosure are described by narrative text, flowcharts, block diagrams of computer systems, and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as integrated circuit design 150. In addition to block 150, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 150, as identified above), peripheral device set 114 (including user interface (UI), device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 150 in persistent storage 113.

COMMUNICATION FABRIC 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface type operating systems that employ a kernel. The code included in block 150 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Referring now to FIG. 2, a schematic illustrating an exemplary six-transistor SRAM cell 200 in accordance with the disclosure is shown. The SRAM cell includes a plurality of gate conductors 202, an n-well region 204 and multiple active regions 206. Active regions 206 that fall within the n-well region 204 are, by definition, p-type devices (PFETs) while active regions 206 that fall outside of the n-well region 204 are n-type devices (NFETs.) The intersection of a gate conductor 202 and an active region 206 defines the transistor of the SRAM cell as shown, for example, by the boxes 212 for a NFET (N1) and a PFET (P2). The gate conductors 202 are configured in such a way as to have a transistor device width 208 in the x-direction and a transistor device length 210 in the direction of the y-axis. As illustrated, the gate conductors 202 of the SRAM cell 200 are configured such that they are substantially parallel to one another in the x-direction. It will be appreciated by those of ordinary skill in the art that the configuration of the SRAM cell 200 illustrated is one of several possible configurations and that the configuration illustrated is not intended to be limiting in any way.

Figure 3:
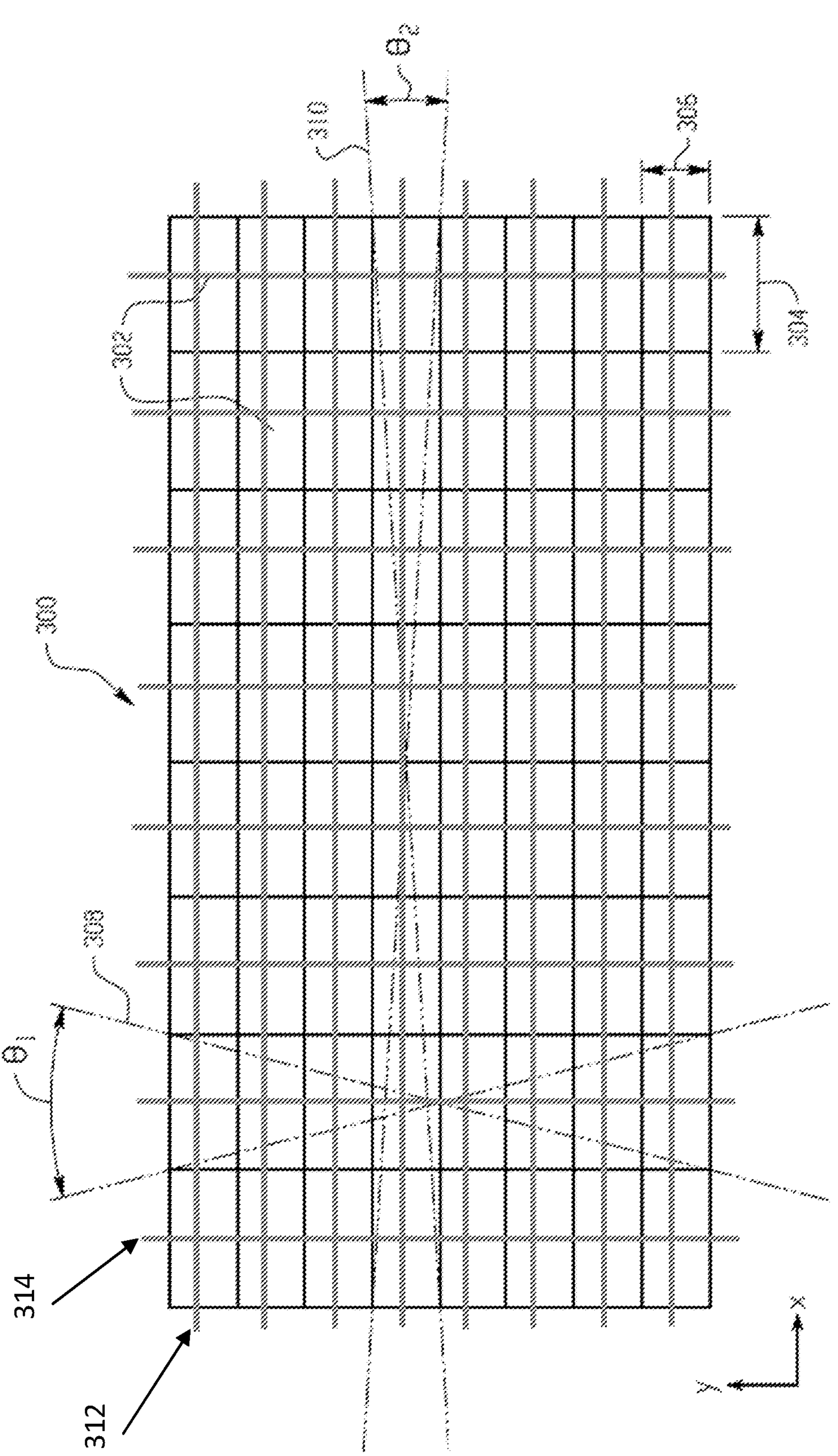
FIG. 3 is a schematic illustrating a two-dimensional array of storage cells in accordance with the disclosure.

Referring now to FIG. 3 is a schematic illustrating a two-dimensional array 300 of storage cells 302, such as the SRAM cell depicted in FIG. 2. In exemplary embodiments, the storage cells 302 may be SRAM cells, latches, register file cells, content-addressable memory cells, flip-flops, DRAM, e-DRAM, or any other storage cell. It will be appreciated by those of ordinary skill in the art that the configuration of the storage cells 302 in the array 300 illustrated is one of several possible configurations and that the configuration illustrated is not intended to be limiting in any way. In exemplary embodiments, each storage cell 302 is located at the intersection of a word line 314 and a bit line 314.

During operation of the array 300 of storage cells 302 a particle, or particle beam 308, 310, can impact two or more storage cells 302 thereby causing a multi-bit upset ("MBU"). Due to the dimensions of the storage cells 302, particularly the difference in the length 304 and width 306 of the gates (304 and 306 are the x- and y-dimensions of the storage cell), a particle, or particle beam 308, traveling generally in the y-direction has a much higher likelihood of impacting a plurality of storage cells 302 and causing an upset in more than one cell as compared to a particle, or particle beam 310, traveling generally in the x-direction. In exemplary embodiments, the range of the angles that a particle or particle beam 308 can strike the storage cells gates in the array 300 in the y-direction and cause an MBU can be represented by $\Theta_1$ and the range of the angles that a particle or particle beam 310 can strike the storage cells gates in the array 300 in the x-direction and cause an MBU can be represented by $\Theta_2$. In exemplary embodiments, when the length 304 of the gates of the storage cells 302 is greater than the width 306 of the gates of the storage cells 302, $\Theta_1$ will be greater than $\Theta_2$. In addition, the probability that a particle will cause an MBU in a given direction, for example the y-direction, is proportional to the range of the angles, for example $\Theta_1$. The different probabilities of MBUs in each direction may be further compounded by the difference in length and width of the gate conductors, which may have length-width ratios larger than 10.

In addition to the dimensions of the storage cells 302, the orientation of the array 300 has a substantial impact on the likelihood of a particle, or particle beam 310 impacting a plurality of storage cells 302 and causing an MBU because energetic particles from cosmic rays are coming predominantly down from the sky in a direction that is substantially parallel to the direction of gravity. In one example, the y-direction is a direction that is substantially parallel to the direction of gravity (i.e., up and down) and the x-direction is a direction that is substantially perpendicular to the direction of gravity (i.e., side-to-side). In general, the occurrence of particles, or particle beams, decreases as deviation from the y-direction increases. For example, the likelihood of a particle beam traveling in the y-direction is twice as high as a particle beam traveling in at an angle offset from the y-direction by forty-five degrees. In exemplary embodiments, the storage cells may include, but are not limited to, latches, CAMs, register files, flip-flops, DRAM, e-DRAM and LCBs.

Figure 4A:
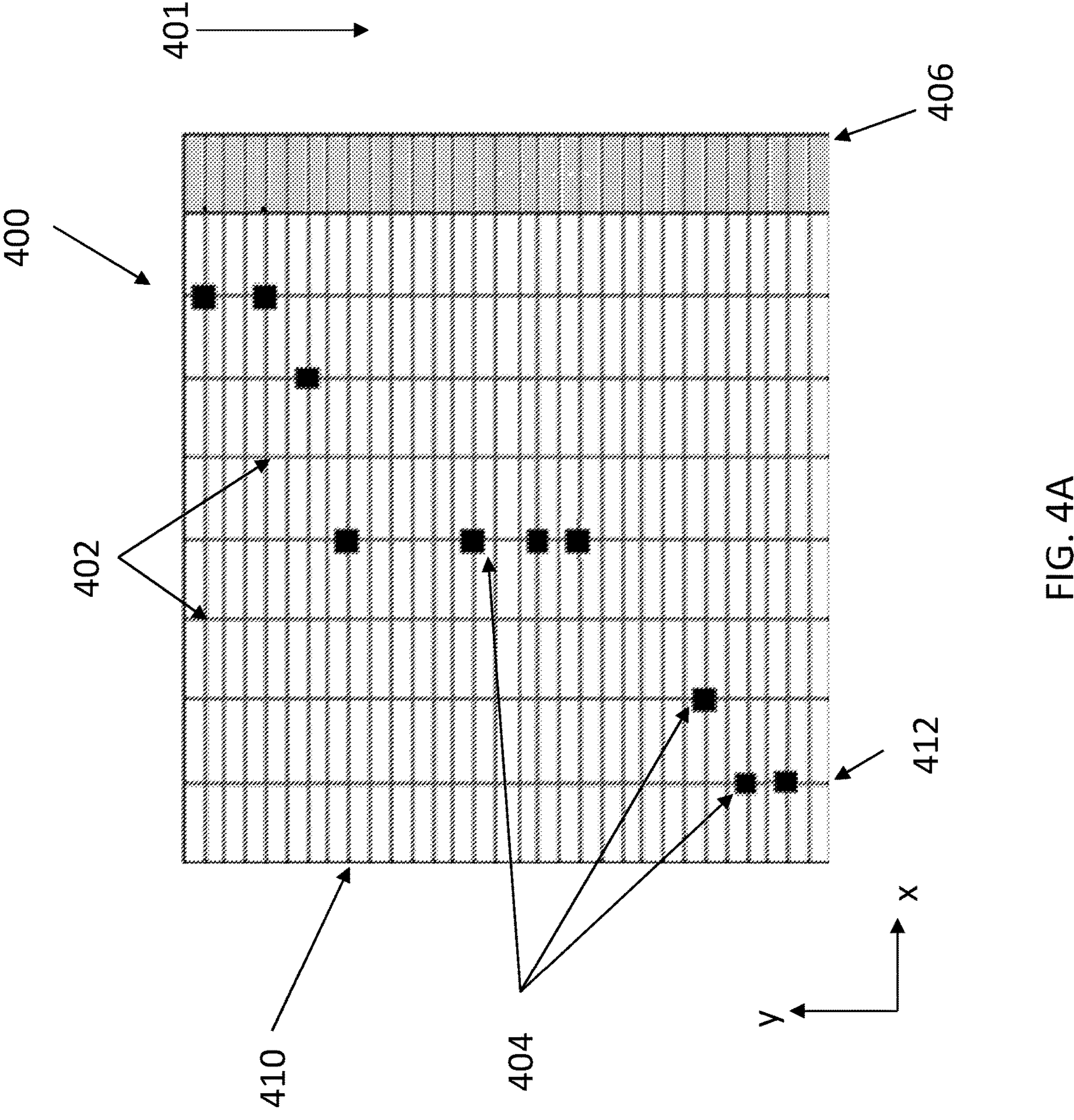
FIG. 4A is a schematic illustrating a two-dimensional array of storage cells with multi-bit upsets in accordance with the disclosure.

Referring now to FIG. 4A, a memory array 400 is shown with word lines 410 running in the x-direction and bit lines 412 running in the y-direction. The x-direction is substantially perpendicular to a gravitational force direction 401 and the y-direction is substantially parallel to a gravitational force direction 401. The array 400 includes a plurality of storage cells 402 that are located at the intersections of the word lines 410 and bit lines 412. As illustrated, the array 400 includes a plurality of storage cells 404 which have experienced an error or bit flip caused by a particle, such as a proton. Based on the configuration of the storage cells 402 in the array 400, the word lines 410 are disposed substantially perpendicular to a gravitational force direction 401 and the bit lines 412 are disposed substantially parallel with the gravitational force direction 401, (i.e., the bit lines 412 extend up and down and the word lines 410 extend side to side). In exemplary embodiments, the memory array 400 includes an error control mechanism 406 that is configured to detect errors that occur in the word line 410.

Figure 4B:
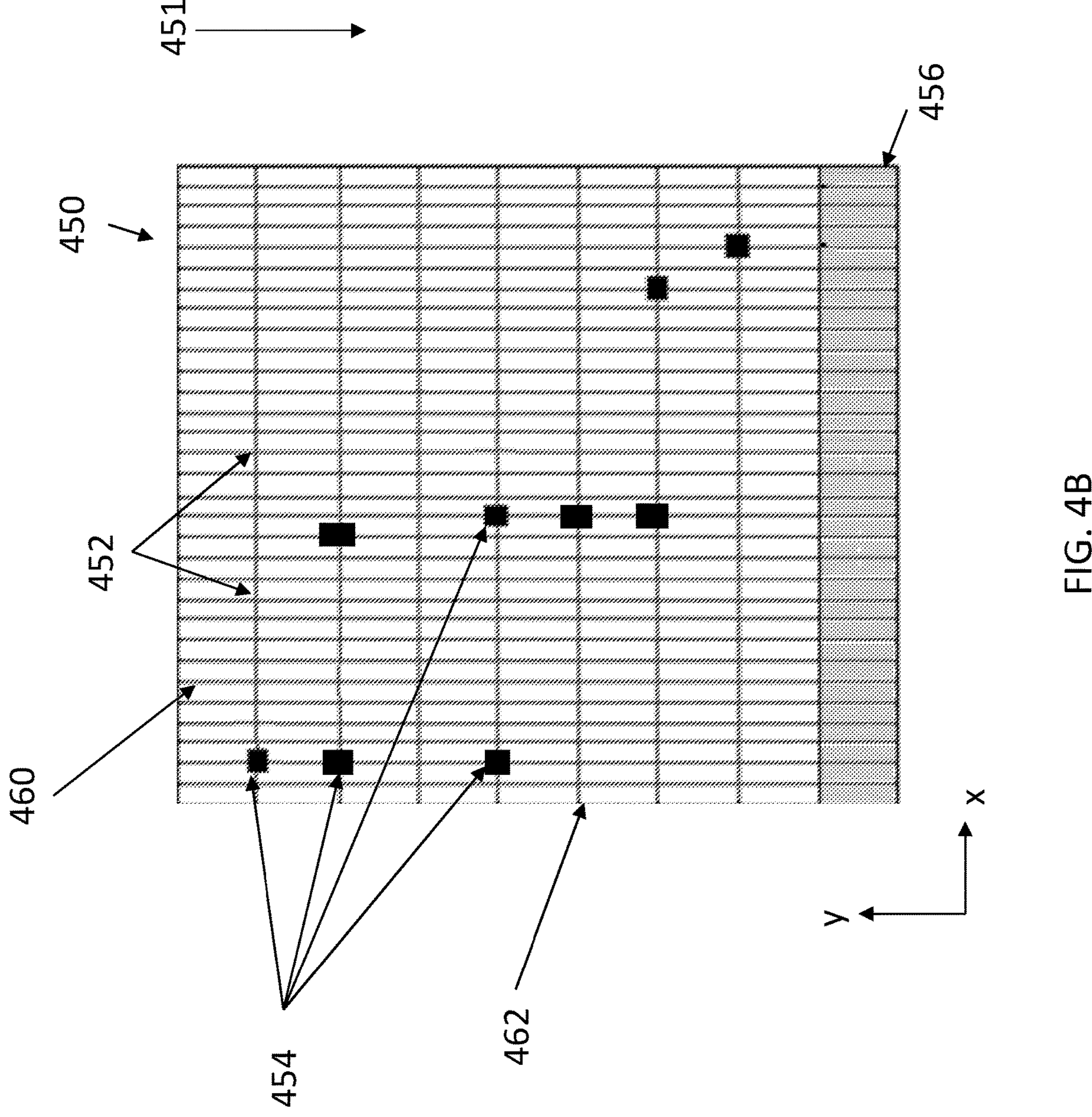
FIG. 4B is a schematic illustrating a two-dimensional array of storage cells with multi-bit upsets in accordance with the disclosure.

FIG. 4B illustrates a memory array 450 that is similar to the memory array 400 but has been rotated such that the word lines 460 run in the y-direction and bit lines 462 run in the x-direction. The x-direction is substantially perpendicular to a gravitational force direction 401 and the y-direction is substantially parallel to a gravitational force direction 401. The memory array 450 includes a plurality of storage cells 452 that are located at the intersections of the word lines 460 and bit lines 462. As illustrated, the array 450 includes a plurality of storage cells 454 which have experienced an error or bit flip caused by a particle, such as a proton. Based on the configuration of the storage cells 452 in the array 450, the bit lines 462 are disposed substantially perpendicular to a gravitational force direction 451 and the word lines 460 are disposed substantially parallel with the gravitational force direction 451, (i.e., the word lines 460 extend up and down and the bit lines 412 extend side-to-side). In exemplary embodiments, the memory array 450 includes an error control mechanism 456 that is configured to detect errors that occur in the word line 460.

In exemplary embodiments depending upon the application and the level of error detection and/or protection desired the error control mechanism 406, 456 may include a parity protection bit, an error control coding ("ECC"), or another form of error detection and correction. In general, parity protection provides single-bit error detection, but it does not handle even numbers of multi-bit errors, and provides no way to correct detected errors. Advanced error detection and correction protocols, such as single-error correction double-error detection codes, are capable of detecting both single-bit and multi-bit errors and correcting single-bit errors. These protocols use a special algorithm to encode information in a block of bits that contains sufficient detail to permit the recovery of one or more bit errors in the data. Unlike parity protection, which uses a single bit to provide protection to some number of bits, ECC circuits may use larger groupings such as 7 bits to protect 32 bits, or 8 bits to protect 64 bits. In general, the strength of an error control mechanism is represented by the Hamming distance of the error control mechanism, which indicates the minimum number of binary digits that differ between any two code words in the code.

In one embodiment, the error control mechanism 406, 456 may be a single bit parity protection configured to detect errors that occur in the word line. For example, the single bit parity protection will be able to detect each of the illustrated the single bit upsets in storage cells 404, as shown in FIG. 4A. Furthermore, if the error control mechanism 406 is an ECC, the ECC will be able to detect and correct each of the single bit upsets in storage cells 404, as shown in FIG. 4A.

In contrast, if the orientation of the storage array 450 was in the orientation shown in FIG. 4B, the error control mechanism 456 would be significantly less effective at detecting the upsets shown in the storage cells 454. For example, in the array shown in FIG. 4B, if the error control mechanism 456 was a parity protection bit, the error control mechanism 456 would not be capable of detecting the multi-bit upsets illustrated. Accordingly, by selecting the orientation of the storage array 400 such that the word lines 410, which are protected by the ECC 406, are in a direction perpendicular to the gravitational direction 401, the effectiveness of the error control mechanism 406 is increased and the overhead associated with the error control mechanism 406 can be decreased.

Figure 5:
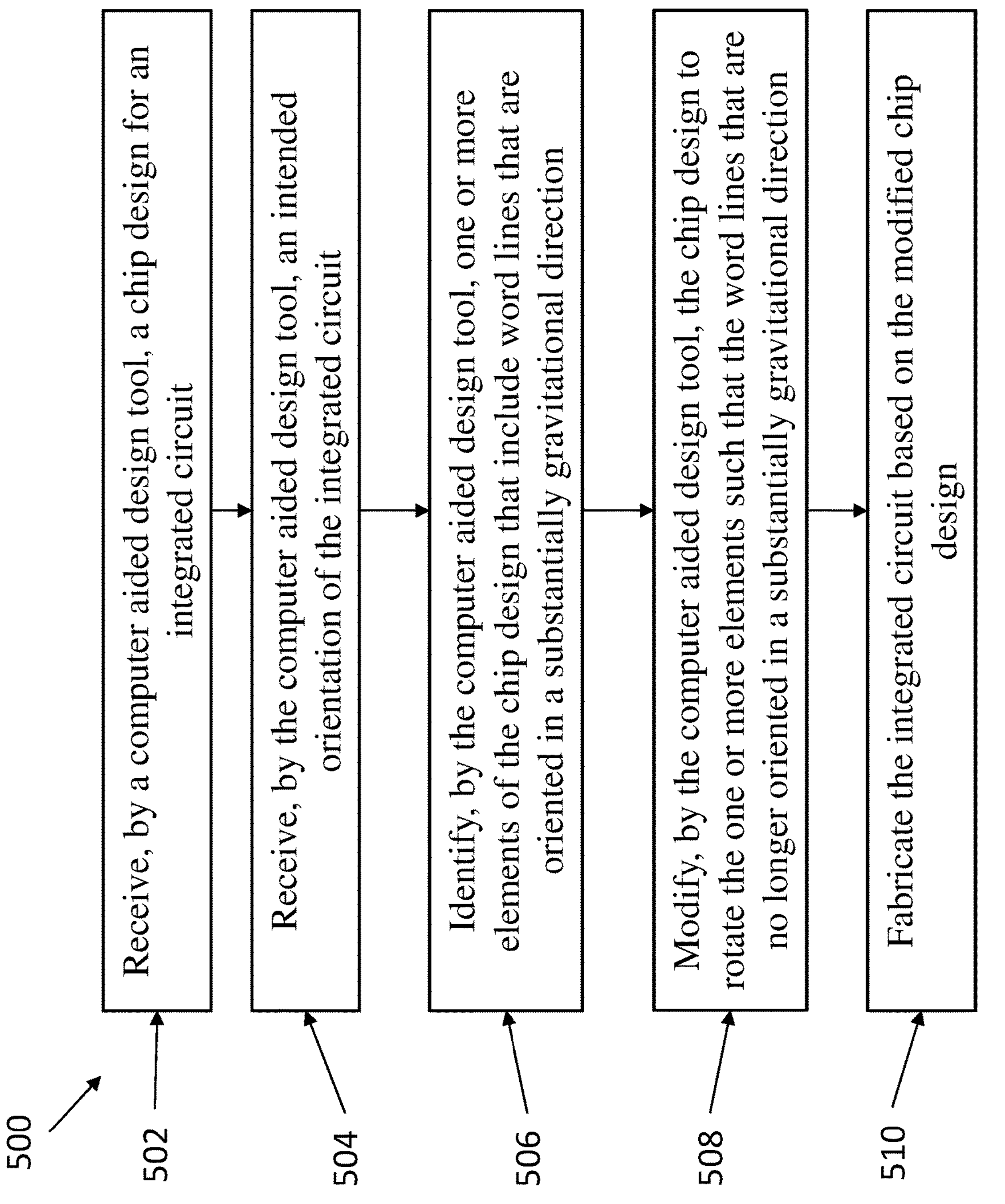
FIG. 5 is a flow diagram that illustrates a method for bit line alignment for the reduction of soft errors during the design of an integrated circuit for an array of storage cells in accordance with an exemplary embodiment.

Referring now to FIG. 5, a flow diagram that illustrates a method 500 for bit line alignment for the reduction of soft errors during the design of an integrated circuit in accordance with an exemplary embodiment is shown. As illustrated at block 502, the method 500 includes receiving, by a computer aided design tool, a chip design for the integrated circuit. Next, as shown at block 504, the method 500 includes receiving, by a computer aided design tool, an intended orientation of the integrated circuit. In exemplary embodiments, the intended orientation includes an orientation that the integrated circuit is intended to be placed in during operation. In one embodiment, the intended orientation includes an identification of a first surface, or edge, of the integrated circuit that will be an upper surface of the integrated circuit, i.e., the surface of the integrated circuit that will face upward and have a planar surface that is substantially normal to a gravitational direction.

The method 500 also includes identifying one or more elements of the chip design that include word lines that are oriented in a substantially gravitational direction, as shown at block 506. In exemplary embodiments, the one or more elements of the chip design include, but are not limited to, storage arrays. Next, as shown at block 508, the method 500 includes modifying the chip design to rotate the one or more elements such that the word lines that are no longer oriented in a substantially gravitational direction. In one embodiment, modifying the chip design includes rotating the one or more elements such that the word lines that are oriented substantially perpendicular to the gravitational direction. The method 500 concludes at block 510 by fabricating the integrated circuit based on the modified chip design. In exemplary embodiments, the fabricated integrated circuit includes one or more visual indicators of the intended orientation of the integrated circuit.

Figure 6:
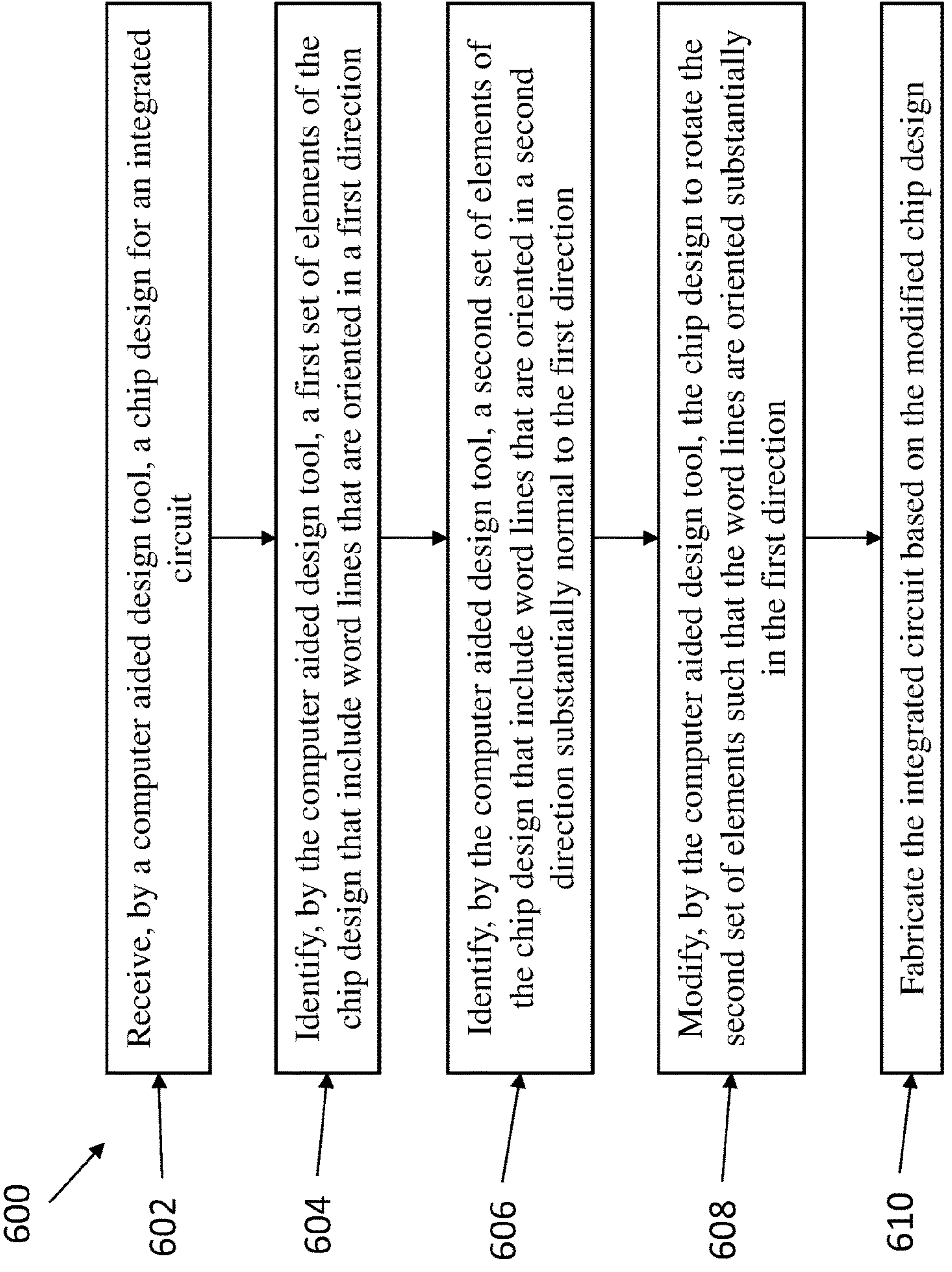
FIG. 6 is a flow diagram that illustrates another method for bit line alignment for the reduction of soft errors during the design of an integrated circuit in accordance with an exemplary embodiment.

Referring now to FIG. 6, a flow diagram that illustrates a method 600 for bit line alignment for the reduction of soft errors during the design of an integrated circuit in accordance with an exemplary embodiment is shown. As illustrated at block 602, the method 600 includes receiving, by a computer aided design tool, a chip design for the integrated circuit. Next, as shown at block 604, the method 600 includes identifying, by the computer aided design tool, a first set of elements of the chip design that include word lines that are oriented in a first direction. In exemplary embodiments, the one or more elements of the chip design include, but are not limited to, storage arrays.

The method 600 also includes identifying a second set of elements of the chip design that include word lines that are oriented in a second direction substantially normal to the first direction, as shown at block 606. Next, as shown at block 608, the method 600 includes modifying, by the computer aided design tool, the chip design to rotate the second set of elements such that the word lines are oriented substantially in the first direction. The method 600 concludes at block 610 by fabricating the integrated circuit based on the modified chip design. In exemplary embodiments, the fabricated integrated circuit includes one or more markings that indicate that the intended orientation of the integrated circuit is such that the second direction be substantially parallel to the gravitational direction and that the first direction be substantially normal to the gravitational direction.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for bit line alignment during the design of an integrated circuit comprising:

receiving a chip design for the integrated circuit;

receiving an intended orientation of the integrated circuit;

identifying one or more elements of the chip design that include word lines that are oriented in a substantially gravitational direction;

modifying the chip design to perform one or more of rotating the one or more elements such that the word lines are no longer oriented in a substantially gravitational direction and rotating the one or more elements such that the word lines are oriented in a direction substantially perpendicular to the gravitational direction, wherein energetic particles from cosmic rays are coming predominantly down from the sky in a direction that is substantially parallel to the direction of gravity, and wherein, due to the dimensions of storage cells a particle traveling generally in the direction that is substantially parallel to the direction of gravity has a much higher likelihood of impacting a plurality of storage cells and causing an upset in more than one cell as compared to a particle traveling generally in a direction substantially perpendicular to the direction of gravity; and causing the fabrication of the integrated circuit based on the modified chip design.

2. The method of claim 1, wherein the intended orientation includes an orientation that the integrated circuit is intended to be placed in during operation.

3. The method of claim 2, wherein the intended orientation includes an identification of a first surface of the integrated circuit that will be an upper surface of the integrated circuit.

4. The method of claim 1, wherein the one or more elements of the chip design include a storage array.

5. The method of claim 1, wherein modifying the chip design includes rotating the one or more elements such that the word lines that are oriented substantially perpendicular to the gravitational direction.

6. The method of claim 1, wherein the fabricated integrated circuit includes one or more visual indicators of the intended orientation of the integrated circuit.

7. The method of claim 1, wherein the word lines are protected by an error control mechanism configured to detect errors that occur in the word line, wherein the effectiveness of the error control mechanism is increased and overhead associated with the error control mechanism can be decreased when selecting the orientation of the integrated circuit such that the word lines are in a direction perpendicular to the gravitational direction.

8. A computer system for bit line alignment during the design of an integrated circuit the computer system comprising a processor, the computer system configured to perform a method comprising:

receiving a chip design for the integrated circuit;

receiving an intended orientation of the integrated circuit;

identifying one or more elements of the chip design that include word lines that are oriented in a substantially gravitational direction;

modifying the chip design to perform one or more of rotating the one or more elements such that the word lines are no longer oriented in a substantially gravitational direction and rotating the one or more elements such that the word lines are oriented in a direction substantially perpendicular to the gravitational direction, wherein energetic particles from cosmic rays are coming predominantly down from the sky in a direction that is substantially parallel to the direction of gravity, and wherein, due to the dimensions of storage cells a particle traveling generally in the direction that is substantially parallel to the direction of gravity has a much higher likelihood of impacting a plurality of storage cells and causing an upset in more than one cell as compared to a particle traveling generally in a direction substantially perpendicular to the direction of gravity; and causing the fabrication of the integrated circuit based on the modified chip design.

9. The computer system of claim 8, wherein the intended orientation includes an orientation that the integrated circuit is intended to be placed in during operation.

10. The computer system of claim 9, wherein the intended orientation includes an identification of a first surface of the integrated circuit that will be an upper surface of the integrated circuit.

11. The computer system of claim 8, wherein the one or more elements of the chip design include a storage array.

12. The computer system of claim 8, wherein modifying the chip design includes rotating the one or more elements such that the word lines that are oriented substantially perpendicular to the gravitational direction.

13. The computer system of claim 8, wherein the fabricated integrated circuit includes one or more visual indicators of the intended orientation of the integrated circuit.

14. The computer system of claim 8, wherein the word lines are protected by an error control mechanism configured to detect errors that occur in the word line, wherein the effectiveness of the error control mechanism is increased and overhead associated with the error control mechanism can be decreased when selecting the orientation of the integrated circuit such that the word lines are in a direction perpendicular to the gravitational direction.

15. A computer program product comprising a computer readable storage medium having program instructions embodied therewith, the program instructions executable by one or more processors to cause the one or more processors to perform operations comprising:

receiving a chip design for the integrated circuit;

receiving an intended orientation of the integrated circuit;

identifying one or more elements of the chip design that include word lines that are oriented in a substantially gravitational direction;

modifying the chip design to perform one or more of rotating the one or more elements such that the word lines are no longer oriented in a substantially gravitational direction and rotating the one or more elements such that the word lines are oriented in a direction substantially perpendicular to the gravitational direction, wherein energetic particles from cosmic rays are coming predominantly down from the sky in a direction that is substantially parallel to the direction of gravity, and wherein, due to the dimensions of storage cells a particle traveling generally in the direction that is substantially parallel to the direction of gravity has a much higher likelihood of impacting a plurality of storage cells and causing an upset in more than one cell as compared to a particle traveling generally in a direction substantially perpendicular to the direction of gravity; and causing the fabrication of the integrated circuit based on the modified chip design.

16. The computer program product of claim 15, wherein the intended orientation includes an orientation that the integrated circuit is intended to be placed in during operation.

17. The computer program product of claim 16, wherein the intended orientation includes an identification of a first surface of the integrated circuit that will be an upper surface of the integrated circuit.

18. The computer program product of claim 15, wherein the one or more elements of the chip design include a storage array.

19. The computer program product of claim 15, wherein modifying the chip design includes rotating the one or more elements such that the word lines that are oriented substantially perpendicular to the gravitational direction.

20. The computer program product of claim 15, wherein the fabricated integrated circuit includes one or more visual indicators of the intended orientation of the integrated circuit.

* * * * *